United States Patent
Wu et al.

(10) Patent No.: US 9,614,048 B2
(45) Date of Patent: *Apr. 4, 2017

(54) SPLIT GATE FLASH MEMORY STRUCTURE AND METHOD OF MAKING THE SPLIT GATE FLASH MEMORY STRUCTURE

(71) Applicant: Taiwan Semiconductor Manufacturing Co., Ltd., Hsin-Chu (TW)

(72) Inventors: Chang-Ming Wu, New Taipei (TW); Shih-Chang Liu, Alian Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 83 days.

This patent is subject to a terminal disclaimer.

(21) Appl. No.: 14/306,726

(22) Filed: Jun. 17, 2014

(65) Prior Publication Data

US 2015/0364558 A1    Dec. 17, 2015

(51) Int. Cl.
| | |
|---|---|
| H01L 29/423 | (2006.01) |
| H01L 29/788 | (2006.01) |
| H01L 29/66 | (2006.01) |
| H01L 21/28 | (2006.01) |
| H01L 29/417 | (2006.01) |
| H01L 27/11524 | (2017.01) |

(52) U.S. Cl.
CPC .. *H01L 29/42368* (2013.01); *H01L 21/28273* (2013.01); *H01L 27/11524* (2013.01); *H01L 29/41725* (2013.01); *H01L 29/42328* (2013.01); *H01L 29/6656* (2013.01); *H01L 29/66825* (2013.01); *H01L 29/7883* (2013.01); *H01L 2924/1438* (2013.01)

(58) Field of Classification Search
CPC ......... H01L 29/42364; H01L 29/42368; H01L 29/66825; H01L 2924/1438; H01L 29/7883
See application file for complete search history.

(56) References Cited

U.S. PATENT DOCUMENTS

| | | | |
|---|---|---|---|
| 5,482,881 A * | 1/1996 | Chen | H01L 27/11521 257/314 |
| 5,925,918 A * | 7/1999 | Wu | H01L 21/28061 257/413 |
| 6,121,087 A * | 9/2000 | Mann | H01L 27/105 257/E21.689 |

(Continued)

*Primary Examiner* — Dale E Page
*Assistant Examiner* — Vincent Wall
(74) *Attorney, Agent, or Firm* — Eschweiler & Potashnik, LLC

(57) ABSTRACT

A semiconductor structure of a split gate flash memory cell is provided. The semiconductor structure includes a semiconductor substrate including a source region and a drain region. Further, the semiconductor structure includes a floating gate, a word line, and an erase gate located over the semiconductor substrate between the source and drain regions. The floating gate is arranged between the word line and the erase gate. Even more, the semiconductor structure includes a dielectric disposed between the erase and floating gates. A thickness of the dielectric between the erase and floating gates is variable and increases towards the semiconductor substrate. A method of manufacturing the semiconductor structure is also provided.

15 Claims, 13 Drawing Sheets

(56) References Cited

U.S. PATENT DOCUMENTS

| | | | |
|---|---|---|---|
| 6,365,455 B1 * | 4/2002 | Su | H01L 27/11521 257/E21.422 |
| 6,456,837 B1 * | 9/2002 | Domes | H01M 10/46 361/625 |
| 6,525,367 B1 * | 2/2003 | Moriyama | H01L 27/115 257/314 |
| 6,747,310 B2 * | 6/2004 | Fan | H01L 27/11521 257/316 |
| 7,846,826 B2 * | 12/2010 | Oyu | H01L 21/28044 438/265 |
| 2003/0003657 A1 * | 1/2003 | Kim | H01L 21/28273 438/257 |
| 2004/0256657 A1 * | 12/2004 | Hung | H01L 27/115 257/315 |
| 2008/0105917 A1 * | 5/2008 | Hsieh | H01L 27/11521 257/316 |
| 2008/0248620 A1 * | 10/2008 | Liu | H01L 21/28273 438/257 |
| 2009/0039410 A1 * | 2/2009 | Liu | H01L 21/28273 257/320 |
| 2011/0006355 A1 * | 1/2011 | Shen | H01L 27/11521 257/316 |
| 2011/0248328 A1 * | 10/2011 | Shen | H01L 21/28273 257/316 |
| 2015/0372121 A1 * | 12/2015 | Chen | H01L 29/66825 257/320 |

* cited by examiner

SPLIT GATE FLASH MEMORY STRUCTURE AND METHOD OF MAKING THE SPLIT GATE FLASH MEMORY STRUCTURE

BACKGROUND

Flash memory is an electronic non-volatile computer storage medium that can be electrically erased and reprogrammed. It is used in a wide variety of commercial and military electronic devices and equipment. To store information, flash memory includes an addressable array of memory cells, typically made from floating gate transistors. Common types of flash memory cells include stacked gate memory cells and split gate memory cells (e.g., the third generation SUPERFLASH (ESF3) memory cell). Split gate memory cells have several advantages over stacked gate memory cells, such as lower power consumption, higher injection efficiency, less susceptibility to short channel effects, and over erase immunity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figures 1, 2A, 2B:
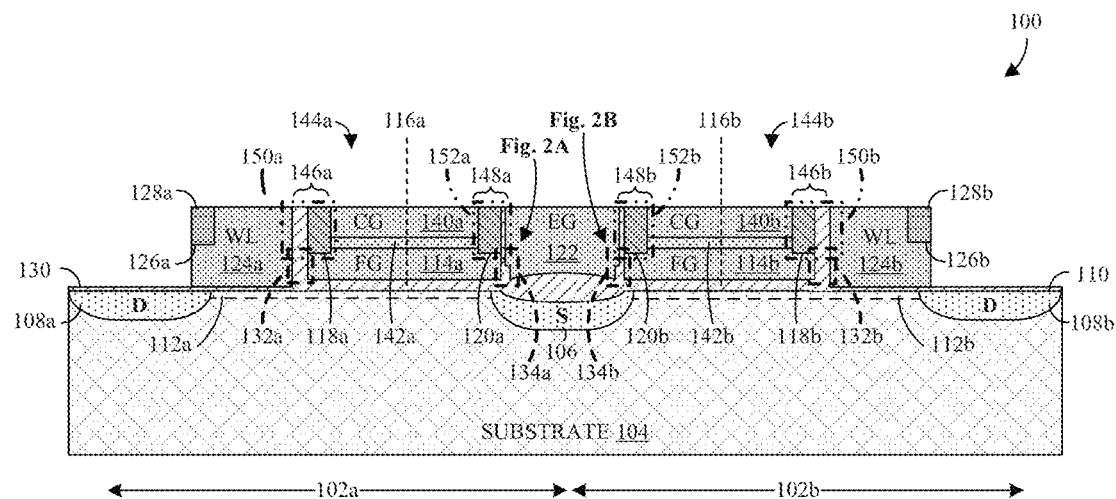
FIG. 1 illustrates a cross-sectional view of some embodiments of a semiconductor structure for a pair of split gate flash memory cells that utilize a variable thickness dielectric between erase and floating gates.
FIGS. 2A & B illustrate an enhanced view of some embodiments of the variable thickness dielectric of FIG. 1.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A split gate flash memory cell includes a floating gate spaced from an erase gate on a semiconductor substrate, and a dielectric region arranged between the erase and floating gates. The dielectric region serves the dual roles of facilitating tunneling (Fowler-Nordheim tunneling) of electrons from the floating gate to the erase gate for erases and insulating the erase gate from the semiconductor substrate to reduce leakage current therebetween (typically during programs and erases). Due to limitations in conventional approaches to manufacturing split gate flash memory cells, the dielectric region has conventionally been limited to a uniform thickness.

Recently, split gate flash memory cells have received great attention due to the development of high memory capacities (relative to other types of flash memory cells). However, with this increased capacity, it has proven difficult to simultaneously achieve higher erase speed and lower leakage current between the erase gate and the semiconductor substrate. One of the reasons for this difficulty is the uniform thickness of the dielectric region between the floating gate and the erase gate. Increasing the thickness of the dielectric region to increase insulation and reduce leakage current between the erase gate and the semiconductor substrate reduces the tunneling of electrons from the floating gate to the erase gate. This, in turn, reduces erase speed. On the other hand, reducing the thickness of the dielectric region to increase erase speed reduces insulation and increases leakage current between the erase gate and the semiconductor substrate. Hence, the dual roles of the dielectric region are in conflict with each other when it comes to the thickness of the dielectric region.

In view of the foregoing, the present disclosure is directed to an improved split gate flash memory cell employing a variable thickness dielectric between an erase gate and a floating gate with a thickness increasing towards a semiconductor substrate over which the floating gate and the erase gate are formed. The present disclosure is further directed to an approach to manufacturing the improved split gate flash memory cell. As discussed in greater detail hereafter, the improved split gate flash memory cell advantageously allows reduction of leakage current between the erase gate and the semiconductor substrate while simultaneously increasing erase speed.

With reference to FIG. 1, a cross-sectional view of an improved semiconductor structure 100 for a pair of split gate flash memory cells 102a, 102b according to some embodiments is provided. The semiconductor structure 100 includes a semiconductor substrate 104. The semiconductor substrate 104 is n-type or p-type, and can, for example, be a bulk silicon substrate or a silicon-on-insulator (SOI) substrate. If present, an SOI substrate is often made up of an active layer of high quality silicon in which the memory cells 102a, 102b are formed. In such instances, the memory cells 102a, 102b are arranged over a buried layer (BOX) of electrically insulating silicon dioxide, which is arranged over a bulk silicon support substrate. Typically, the semiconductor substrate 104 is planar with a uniform thickness.

The semiconductor substrate 104 includes a shared source/drain region 106 (shared by the split gate flash memory cells 102a, 102b) and two individual source/drain regions 108a, 108b (individual to the split gate flash memory cells 102a, 102b). The shared and individual source/drain regions 106, 108a, 108b may be of the same type (i.e., n-type or p-type) and of the opposite type as the semiconductor substrate 104. Alternatively, the shared and individual source/drain regions 106, 108a, 108b may be of opposite type as a well region or active region in which the split gate flash memory cells 102a, 102b are formed. Further, the shared and individual source/drain regions 106, 108a, 108b are embedded within a top surface 110, typically a planar top surface, of the semiconductor substrate 104 (e.g., by doping) and are spaced to define a channel region 112a, 112b between each individual source/drain region 108a, 108b and the shared source/drain region 106. The channel regions 112a, 112b correspond to the different split gate flash memory cells 102a, 102b of the pair.

Over each channel region 112a, 112b (i.e., for each split gate flash memory cell 102a, 102b), the semiconductor structure 100 includes a floating gate 114a, 114b. In some embodiments, the floating gate 114a, 114b may be symmetrical about an axis 116a, 116b running perpendicular to the surface 110. Further, the floating gate 114a, 114b may be recessed proximate to the corresponding individual source/drain region 108a, 108b to define a peripheral floating gate ledge 118a, 118b, and recessed proximate to the shared source/drain region 106 to define a central floating gate ledge 120a, 120b. The peripheral and central floating gate ledges 118a, 118b, 120a, 120b exhibit a reduced height relative to a top surface of the floating gate 114a, 114b and run along opposing floating gate edges facing the individual source/drain region 108a, 108b and the shared source/drain region 106, respectively. In this way, the floating gate 114a, 114b has a symmetrical, stepped appearance when viewed in profile.

Over the shared source/drain region 106 and spaced between the floating gates 114a, 114b, the semiconductor structure 100 includes an erase gate 122 shared by the split gate flash memory cells 102a, 102b of the pair. Further, adjacent to or partially over each individual source/drain region 108a, 108b, and spaced between the individual source/drain region 108a, 108b and the floating gate 114a, 114b, the semiconductor structure 100 includes a word line 124a, 124b. Similar to the floating gate 114a, 114b, the word line 124a, 124b may include a word line ledge 126a, 126b upon which a dielectric 128a, 128b, such as silicon nitride, rests.

Disposed between the semiconductor substrate 104 and the floating and erase gates 114a, 114b, 122, as well as between the semiconductor substrate 104 and the word lines 124a, 124b, the semiconductor structure 100 includes a base dielectric region 130, such as silicon dioxide, to electrically isolate the floating and erase gates 114a, 114b, 122, as well as the word lines 124a, 124b, from the semiconductor substrate 104. The base dielectric region 130 further includes or is otherwise associated with first peripheral dielectric extensions 132a, 132b extending vertically up to the peripheral floating gate ledges 118a, 118b to fill voids between the floating gates 114a, 114b and the word lines 124a, 124b. The first peripheral dielectric extensions 132a, 132b electrically isolate the floating gates 114a, 114b from the word lines 124a, 124b and, in some embodiments, are formed of silicon dioxide. Further, the first peripheral dielectric extensions 132a, 132b typically have a uniform thickness. Even more, the base dielectric region 130 includes or is otherwise associated with first central dielectric extensions 134a, 134b (i.e., the abovementioned variable thickness dielectric) extending vertically up from approximately even with bottom surfaces of the floating gate 114a, 114b to approximately even with the central floating gate ledges 120a, 120b. The first central dielectric extensions 134a, 134b electrically isolate the floating gates 114a, 114b from the erase gate 122 and, in some embodiments, are formed of silicon dioxide.

With reference to FIGS. 2A & B, the first central dielectric extensions 134a, 134b are correspondingly illustrated according to some embodiments. Each first central dielectric extension 134a, 134b includes a variable thickness increasing toward the shared source/drain region 106 from approximately even with a top surface of the floating gate 114a, 114b to approximately even with a bottom surface of the floating gate 114a, 114b. In some embodiments, as illustrated, the first central dielectric extension 134a, 134b achieves this variable thickness by including a top region 136a, 136b arranged atop a bottom region 138a, 138b. The bottom region 138a, 138b is located closer to the shared source/drain region 106 than the top region 136a, 136b and includes a greater thickness than the top region 136a, 136b. The bottom region 138a, 138b includes a bottom surface approximately coplanar with a bottom surface of the floating gate 114a, 114b, and the top region 136a, 136b includes a top surface approximately coplanar with a top surface of the floating gate 114a, 114b (e.g., coplanar with the central floating gate ledge 120a, 120b). Typically, the bottom region 138a, 138b includes a thickness of greater than 100 Angstroms (A), whereas the top region 136a, 136b includes a thickness of about 40-60 A. The reduced thickness of the top region 136a, 136b relative to the thickness of the bottom region 138a, 138b promotes the tunneling (Fowler-Nordheim tunneling) of charge carriers (e.g., electrons) between the corresponding floating gate 114a, 114b and the erase gate 122 to increase erase speed. Further, the increased thickness of the bottom region 138a, 138b relative to the thickness of the top region 136a, 136b provides increased insulation between the corresponding floating gate 114a, 114b and the shared drain/source region 106 to reduce leakage current therebetween.

Advantageously, the variable thickness of the first central dielectric extension 134a, 134b allows leakage current between the erase gate 122 and the semiconductor substrate 104 to be reduced while simultaneously increasing erase speed. The increased thickness of the bottom region 138a, 138b of the first central dielectric extension 134a, 134b relative to the thickness of the top region 136a, 136b of the first central dielectric extension 134a, 134b provides greater insulation, while allowing the top region 136a, 136b to have a reduced thickness for improved tunneling of electrons between the floating gate 114a, 114b and the erase gate 122.

Referring back to FIG. 1, the semiconductor structure 100 includes a control gate 140a, 140b and an inter-gate dielectric region 142a, 142b over the top surface of each floating gate 114a, 114b. The inter-gate dielectric region 142a, 142b is interposed between the control gate 140a, 140b and the floating gate 114a, 114b to electrically isolate the floating gate 114a, 114b from the control gate 140a, 140b. The inter-gate dielectric region 142a, 142b is typically an oxide-nitride-oxide (ONO) dielectric, but other types of dielectrics can be used in place of the ONO dielectric.

Each floating gate 114a, 114b, its corresponding control gate 140a, 140b, and its corresponding inter-gate dielectric region 142a, 142b form a stack 144a, 144b. Each stack 144a, 144b corresponds to a different split gate flash memory cell 102a, 102b of the pair. Filling the void between the stack 144a, 144b and the word line 124a, 124b, as well as the void between the stack 144a, 144b and the erase gate 122, the semiconductor structure 100 includes a peripheral dielectric sidewall region 146a, 146b and a central dielectric sidewall region 148a, 148b, respectively, running vertically along opposing sidewalls of the stack 144a, 144b.

The peripheral dielectric sidewall region 146a, 146b is disposed between the stack 144a, 144b and the word line 124a, 124b to electrically isolate the stack 144a, 144b from the word line 124a, 124b, and the central dielectric sidewall region 148a, 148b is disposed between the stack 144a, 144b and the erase gate 122 to electrically isolate the stack 144a, 144b from the erase gate 122. The peripheral and central dielectric sidewall regions 146a, 146b, 148a, 148b also serve as spacers between the stack 144a, 144b, the erase gate 122 and the word line 124a, 124b. The peripheral dielectric sidewall region 146a, 146b includes the corresponding first peripheral dielectric extension 132a, 132b, as well as a second peripheral dielectric extension 150a, 150b extending vertically up from the peripheral floating gate ledge 118a, 118b. Similarly, the central dielectric sidewall region 148a, 148b includes the corresponding first central dielectric extension 134a, 134b, as well as a second central dielectric extension 152a, 152b extending vertically up from the central floating gate ledge 120a, 120b. The second peripheral and central dielectric extensions 150a, 150b, 152a, 152b electrically isolate the control gate 140a, 140b from the word line 124a, 124b and the erase gate 122, respectively. Further, the second peripheral and central dielectric extensions 150a, 150b, 152a, 152b are typically an ONO dielectric, but other types of dielectrics can alternatively be used in place of the ONO dielectric.

In operation, the floating gates 114a, 114b of the split gate flash memory cells 102a, 102b store different amounts charge (e.g., electrons). The charge is advantageously stored in a non-volatile manner so that the stored charge persists in the absence of power. For example, an electronic device including the split gate flash memory cells 102a, 102b does not require power for data stored in the split gate flash memory cells 102a, 102b to persist. The amount of charge stored represents the difference between a binary "1" and a binary "0" and is varied through program (i.e., write), read, and erase operations. These operations are performed through selective biasing of the erase and control gates 122, 140a, 140b, as well as through selective biasing of the word lines 124a, 124b.

During a program operation on one of the split gate flash memory cells 102a, 102b, a voltage is applied across the shared and individual source/drain regions 106, 108a, 108b of the split gate flash memory cell 102a, 102b. This voltage is typically applied so as to promote the migration of charge from the individual source/drain region 108a, 108b to the shared source/drain region 106 when the channel region 112a, 112b is in a conductive state. Further, a voltage is applied to the erase gate 122. Typically, the voltage is the same voltage applied to the shared source/drain region 106 so as to prevent the migration of charge between the erase gate 122 and the shared source/drain region 106. Even more, a voltage is applied to the word line 124a, 124b to induce part of the channel region 112a, 112b to conduct. Application of a voltage to the word line 124a, 124b attracts carriers to part of the channel region 112a, 112b adjacent to the word line 124a, 124b. The voltage applied to the word line 124a, 124b is typically less than the voltage applied to the shared source/drain region 106.

To complete the program operation, a voltage is applied to the control gate 140a, 140b. Typically, this voltage is high relative to the voltage applied to the word line 124a, 124b and the erase gate 122, as well as the voltage applied across the shared and individual source/drain regions 106, 108a, 108b. Application the voltage to the control gate 140a, 140b induces the remaining part of the channel region 112a, 112b to conduct through attraction of carriers. This, in turn, allows electric current to flow between the shared and individual source/drain regions 106, 108a, 108b (e.g., electrons flow from the individual source/drain region 108a, 108b to the shared source/drain region 106). Further, application of the voltage to the control gate 140a, 140b further promotes some of the carriers (e.g., electrons) from the channel region 112a, 112b to tunnel through the base dielectric region 130 to the floating gate 114a, 114b. The carriers are consequently stored within the floating gate 114a, 114b in a non-volatile manner.

The charge resulting from the stored carriers screen an electric field formed between the control gate 140a, 140b and the channel region 112a, 112b when the control gate 140a, 140b is biased. This has an effect of increasing the threshold voltage $V_{th}$ of the split gate flash memory cell 102a, 102b by an amount $\Delta V_{th}$ that is proportional to the thickness of the base dielectric region 130 between the floating gate 114a, 114b and the channel region 112a, 112b. The threshold voltage increase $\Delta V_{th}$ provides the basis of a read operation on the split gate flash memory cell 102a, 102b. By applying a voltage $V_{CG}$ to the control gate 140a, 140b that is greater than $V_{th}$, but less than $V_{th}+\Delta V_{th}$, the stored state within the split gate flash memory cell 102a, 102b can be sensed. If the split gate flash memory cell 102a, 102b turns on (i.e., allows charge to flow) during application of the voltage $V_{CG}$, then it stores a first data state (e.g., a logical "0"). If the split gate flash memory cell 102a, 102b does not turn on, then it stores a second data state (e.g., a logical "1").

During a read operation on one of the split gate flash memory cells 102a, 102b, a voltage is applied across the shared and individual source/drain regions 106, 108a, 108b of the split gate flash memory cell 102a, 102b. Typically, this voltage is applied so as to promote the migration of charge from the shared source/drain region 106 to the individual source/drain region 108a, 108b when the channel region 112a, 112b is in a conductive state. Further, a voltage is applied to the erase gate 122. Typically, the voltage is the same voltage applied to the shared source/drain region 106 so as to prevent the migration of charge between the erase gate 122 and the shared source/drain region 106. Even more, a voltage is applied to the word line 124a, 124b to induce part of the channel region 112a, 112b to conduct. More specifically, application of a voltage to the word line 124a, 124b attracts carriers to part of the channel region 112a, 112b adjacent to the word line 124a, 124b. The voltage applied to the word line 124a, 124b is typically less than the voltage applied to the shared source/drain region 106. To complete the read operation, the voltage $V_{CG}$ is applied to the control gate 140a, 140b. This voltage is such that it falls between the threshold voltage and the threshold voltage increase $\Delta V_{th}$ (i.e., $V_{th}<V_{CG}<V_{th}+\Delta V_{th}$).

During an erase operation on one of the split gate flash memory cells 102a, 102b, a common voltage is applied to the shared and individual source/drain regions 106, 108a, 108b, as well as the control gate 140a, 140b and the word line 124a, 124b. Even more, a voltage high relative to the common voltage is applied to the erase gate 122. This high voltage promotes charge stored in the floating gate 114a, 114b to tunnel through the first central dielectric extension 134a, 134b (more specifically, the top region 136a, 136b of the first central dielectric extension 134a, 134b) to the erase gate 122. As a result of this tunneling, the charge is removed from the floating gate 114a, 114b and split gate flash memory cell 102a, 102b is erased. Because the top region 136a, 136b of the first central dielectric extension 134a, 134b has a reduced thickness relative to the bottom region 138a, 138b of the first central dielectric extension 134a, 134b, charge can be tunneled faster than would otherwise be possible if the top region 136a, 136b shared the thickness of the bottom region 138a, 138b. This faster tunneling, in turn, increases erase speed.

In view of the foregoing, a program operation can, for example, be performed by applying +5 volts (V) and 0V to the shared and individual source/drain regions 106, 108a, 108b, respectively, applying +1V to the word line 124a, 124b, +11V to the control gate 140a, 140b, and +5V to the erase gate 122. As another example, a read operation can be performed by applying 0V and +1V to the shared and individual source/drain regions 106, 108a, 108b, respectively, applying +3V to the word line 124a, 124b, +2V to the control gate 140a, 140b, and 0V to the erase gate 122. As yet another example, an erase operation can be performed by applying 0V to the source and drain regions 106, 108a, 108b, 0V to the word line 124a, 124b, 0V to the control gate 140a, 140b, and +13V to the erase gate 122.

Figure 3:
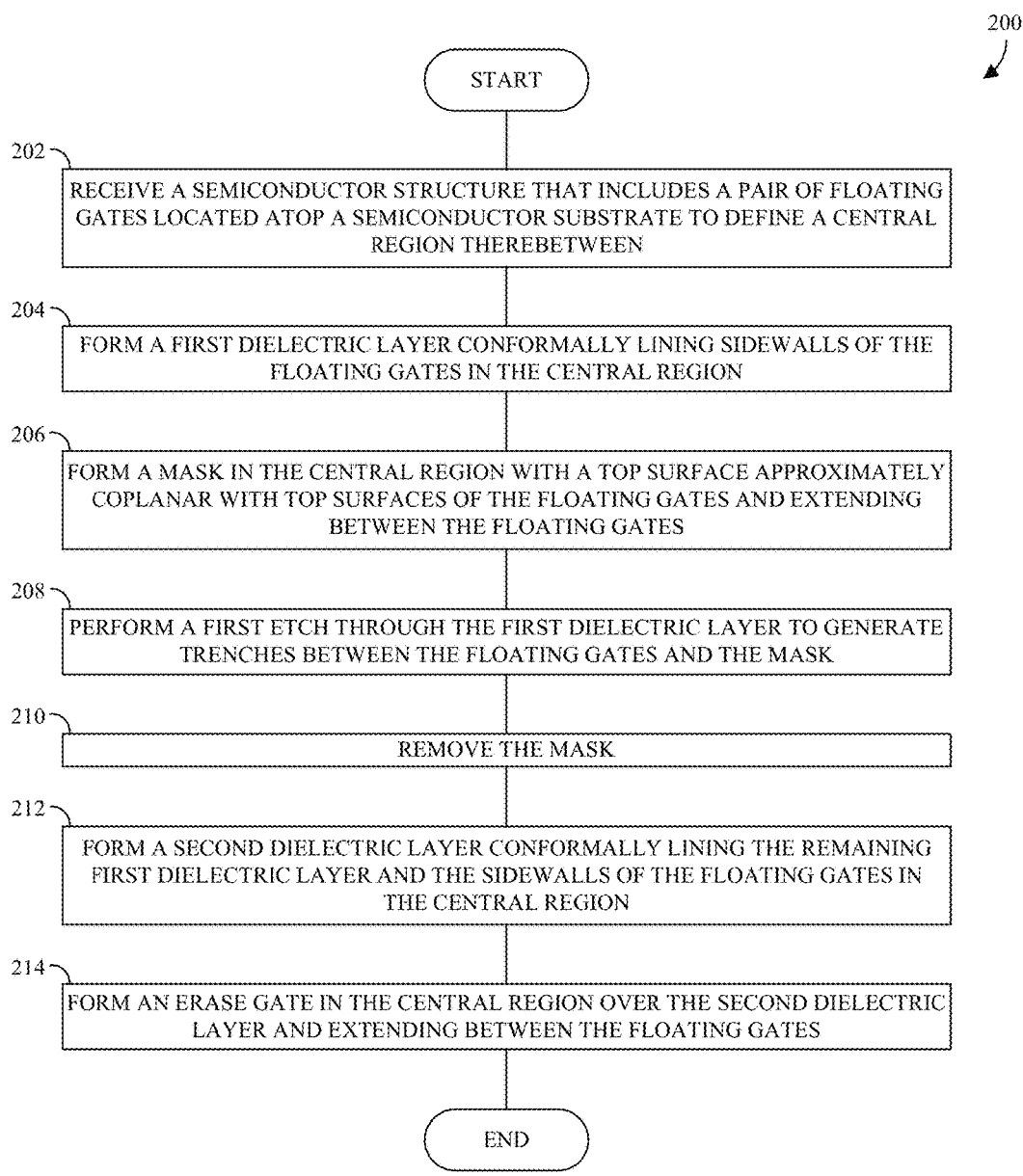
FIG. 3 illustrates a flow chart of some embodiments of a method of manufacturing a variable thickness dielectric between erase and floating gates.

With reference to FIG. 3, a method 200 of manufacturing the first central dielectric extension with a variable thickness is provided according to some embodiments. According to the method 200, a semiconductor structure is received (Action 202) that includes a pair of floating gates spaced atop a semiconductor substrate to define a central region therebetween. Thereafter, a first dielectric layer conformally lining sidewalls of the floating gates is formed in the central region (Action 204). The first dielectric layer has a thickness of approximately 40-60 A. Further, a mask is formed (Action 206) on the first dielectric layer in the central region with a top surface approximately coplanar with top surfaces of the floating gates. Further, the mask fills the space between the floating gates and extends between those portions of the first dielectric layer lining sidewalls of the floating gates.

With the mask formed, a first etch is performed (Action 208) through the first dielectric layer to generate trenches between the floating gates and the mask. During the etch, those portions of the first dielectric layer that are not abutting the mask are first eroded away to leave end portions of the first dielectric layer approximately coplanar with the top surfaces of the floating gates and between the floating gates and the mask. Starting from these end portions, the first dielectric layer is then gradually eroded between the floating gates and the mask towards the semiconductor substrate to create the trenches. The depth of the trenches is controlled by the known etch rate of the first dielectric layer and the amount of time etching is performed. The trenches typically extend to a depth of about a ⅓ to ⅔ of the thickness of the floating gates.

The mask is subsequently removed (Action 210) and a second dielectric layer is formed (Action 212) that conformally lines the remaining first dielectric layer and the sidewalls of the floating gates. An erase gate is then formed (Action 214) in the central region on the second dielectric layer and extending between the floating gates. The etching of the first dielectric layer (Action 208) and the subsequent formation of the second dielectric layer (Action 212) results in a dielectric disposed between the floating gates and the erase gate, which has a variable a thickness (e.g., a first thickness that is equal to a thickness of the second dielectric layer and a second thickness that is equal to a sum of the thicknesses of the first and second dielectric layers).

Figure 4A:
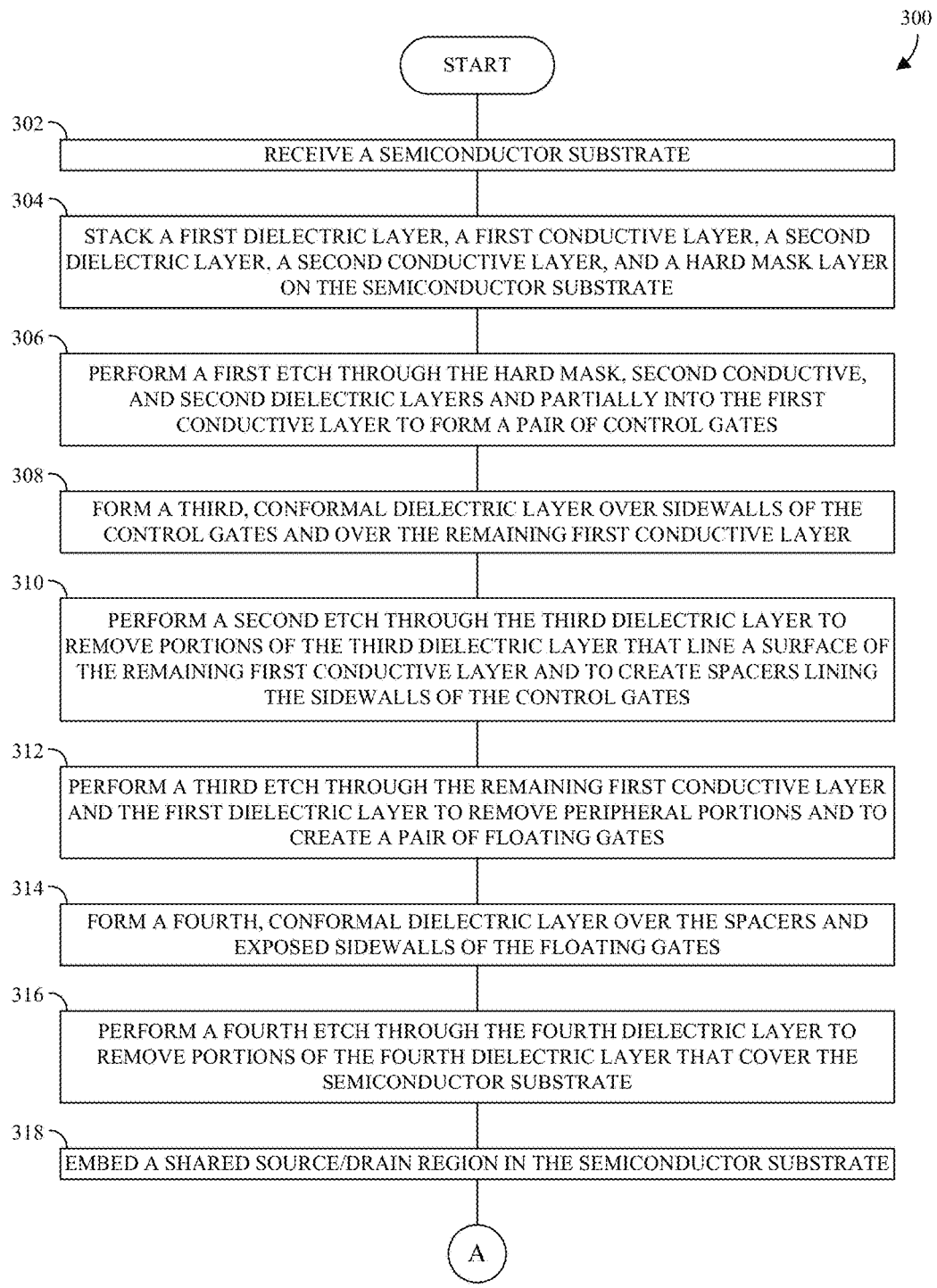
FIGS. 4A & B illustrate flow charts of some embodiments of a method of manufacturing a semiconductor structure for a pair of split gate flash memory cells that utilize a variable thickness dielectric between erase and floating gates.
Figure 4B:
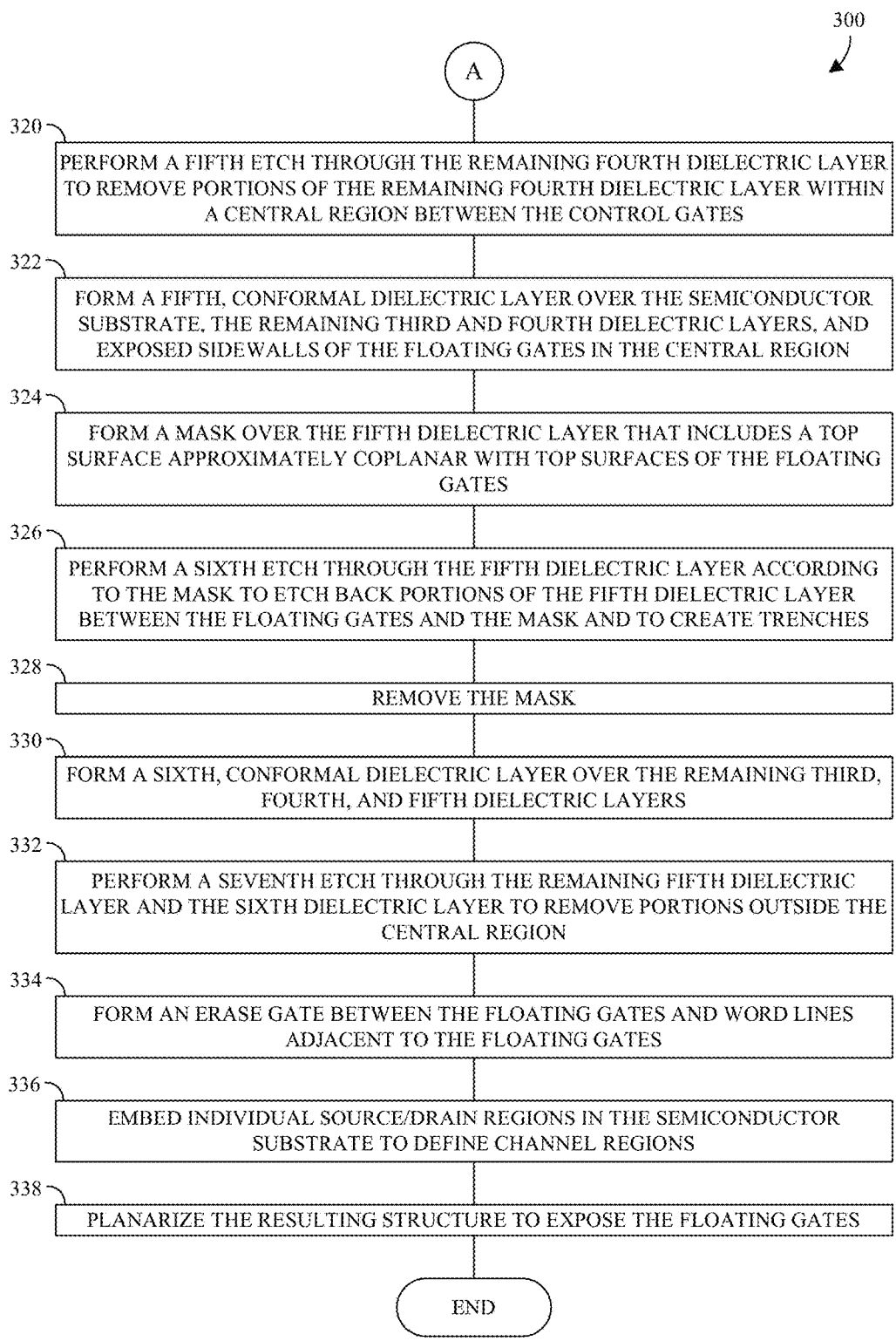

With reference to FIGS. 4A & B, a method 300 of manufacturing the semiconductor structure is provided according to some embodiments. According to the method 300, a semiconductor substrate is received (Action 302). A first dielectric layer, a first conductive layer, a second dielectric layer, a second conductive layer, and a hard mask layer are stacked (Action 304), in that order, on the semiconductor substrate. A first etch is performed (Action 306) through the hard mask, second conductive, and second dielectric layers and partially into the first conductive layer to form a pair of control gates. A third, conformal dielectric layer is formed (Action 308) over sidewalls of the control gates and over the remaining first conductive layer. A second etch is performed (Action 310) through the third dielectric layer to remove portions of the third dielectric layer that line a surface of the remaining first conductive layer and to create spacers lining the sidewalls of the control gates. A third etch is performed (Action 312) through the remaining first conductive layer and the first dielectric layer to remove peripheral portions and to create a pair of floating gates. A fourth, conformal dielectric layer is formed (Action 314) over the spacers and exposed sidewalls of the floating gates, and a fourth etch is performed (Action 316) through the fourth dielectric layer to remove portions of the fourth dielectric layer that cover the semiconductor substrate. A shared source/drain region is embedded (Action 318) in the semiconductor substrate, and a fifth etch is performed (Action 320) through the remaining fourth dielectric layer to remove portions of the remaining fourth dielectric layer within a central region between the control gates.

A fifth, conformal dielectric layer is formed (Action 322) over the semiconductor substrate, the remaining third and fourth dielectric layers, and exposed sidewalls of the floating gates in the central region. The first dielectric layer has a thickness of approximately 40-60 A. Further, a mask is formed (Action 324) over the fifth dielectric layer that includes a top surface approximately coplanar with top surfaces of the floating gates and fills the space between the floating gates. A sixth etch is performed (Action 326) through the fifth dielectric layer according to the mask to etch back portions of the fifth dielectric layer between the floating gates and the mask and to create trenches. During the sixth etch, those portions of the fifth dielectric layer that are not abutting the mask are first eroded away to leave end portions of the fifth dielectric layer approximately coplanar with top surfaces of the floating gates and between the floating gates and the mask. Starting from these end portions, the fifth dielectric layer is then gradually eroded between the floating gates and the mask towards the semiconductor substrate to create the trenches. The mask is removed (Action 328) the mask, and a sixth, conformal dielectric layer is formed (Action 330) over the remaining third, fourth, and fifth dielectric layers.

A seventh etch is performed (Action 332) through the remaining fifth dielectric layer and the sixth dielectric layer to remove portions outside the central region. An erase gate is formed (Action 334) between the floating gates and word lines are formed (Action 334) adjacent to the floating gates. Individual source/drain regions are embedded (Action 336)

in the semiconductor substrate to define channel regions, and the resulting structure is planarized (Action 338) to expose the floating gates.

While the disclosed methods (e.g., the methods 200 and 300) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 5A:
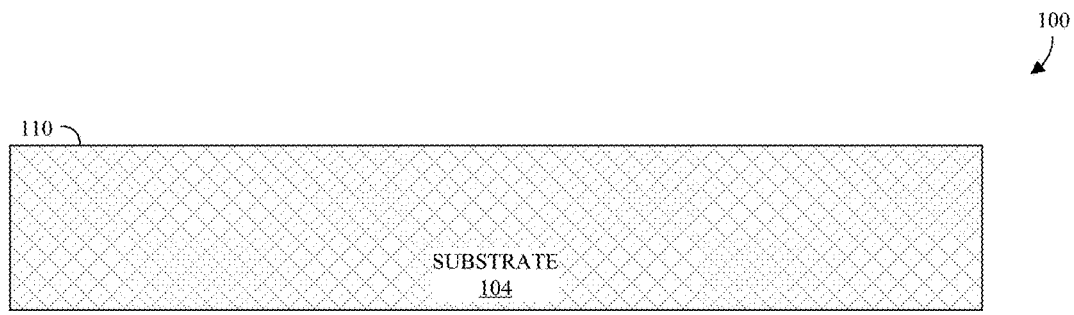
FIGS. 5A-Q illustrate a series of cross-sectional views of some embodiments of a semiconductor structure at various stages of manufacture for a pair of split gate flash memory cells that utilize a variable thickness dielectric between erase and floating gates.
Figure 5B:
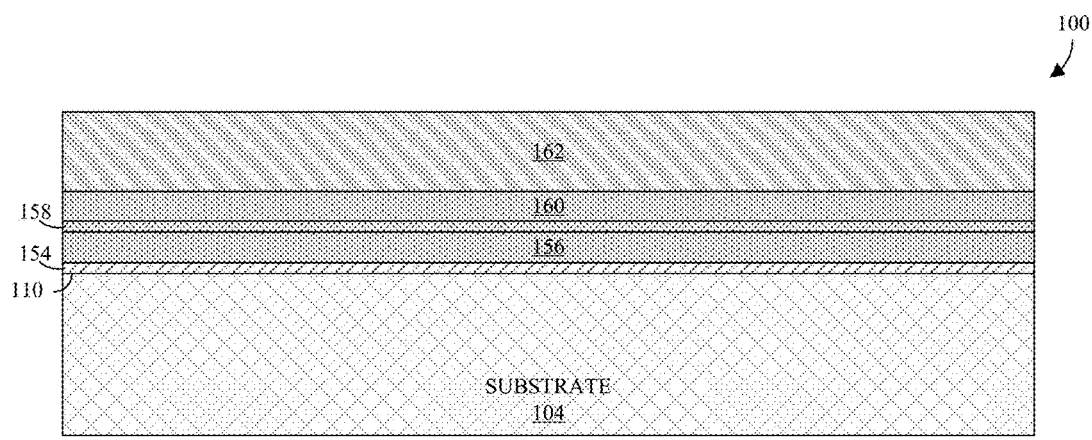
Figure 5C:
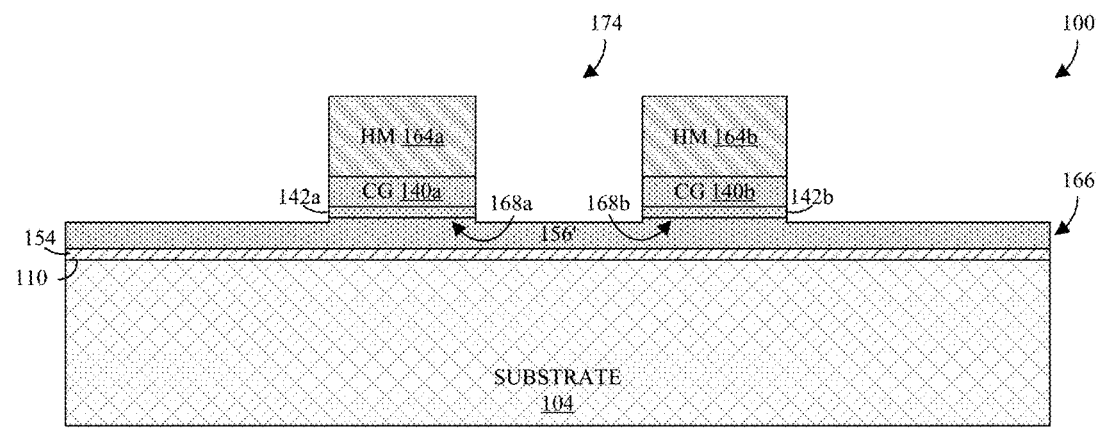
Figure 5D:
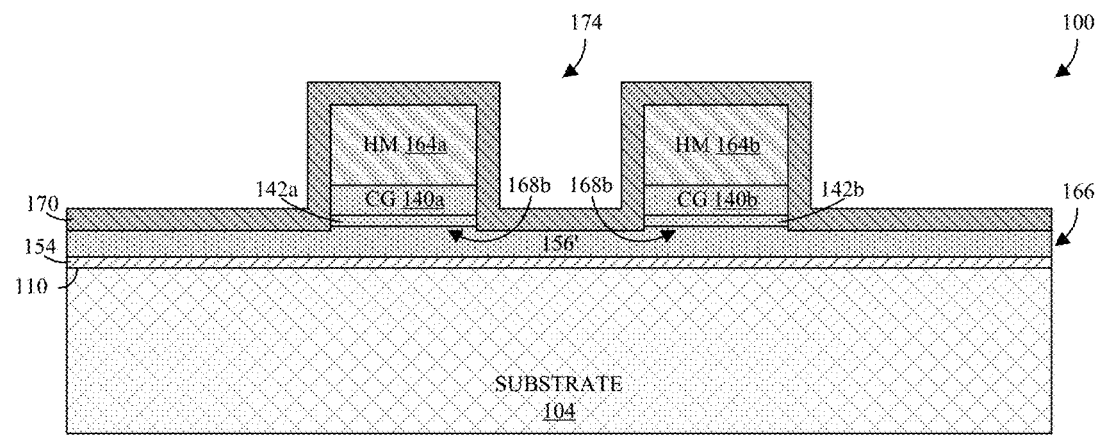
Figure 5E:
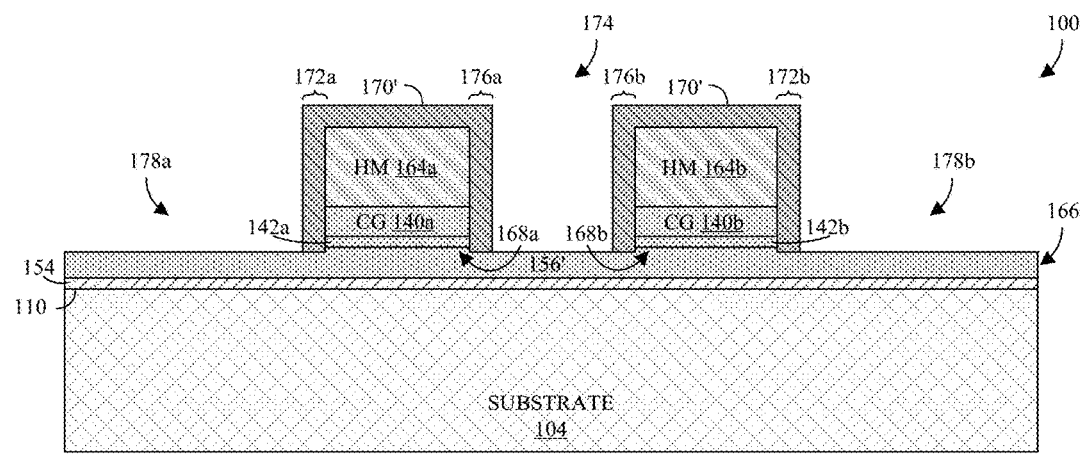
Figure 5F:
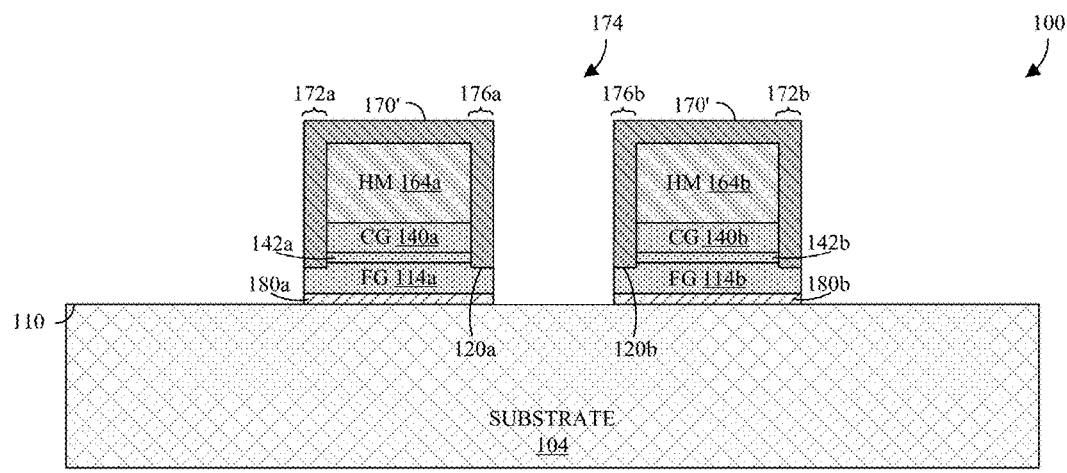
Figure 5G:
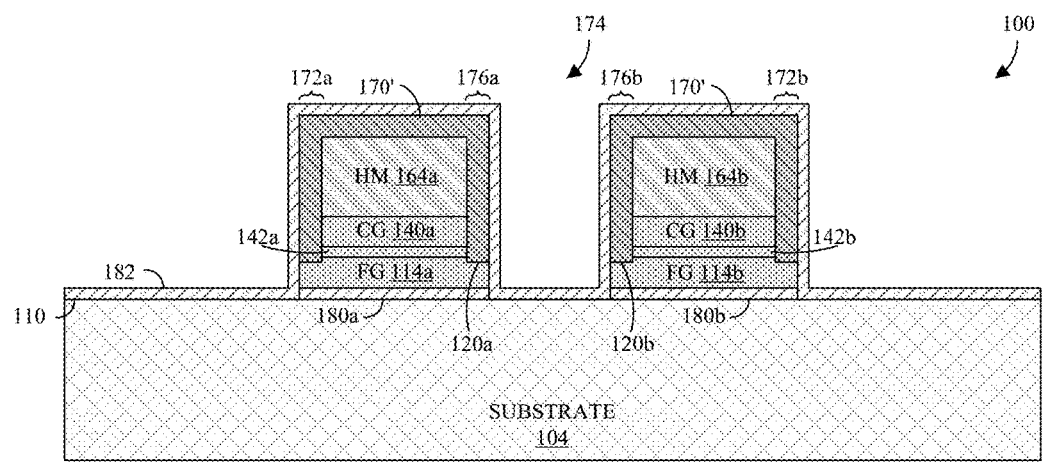
Figure 5H:
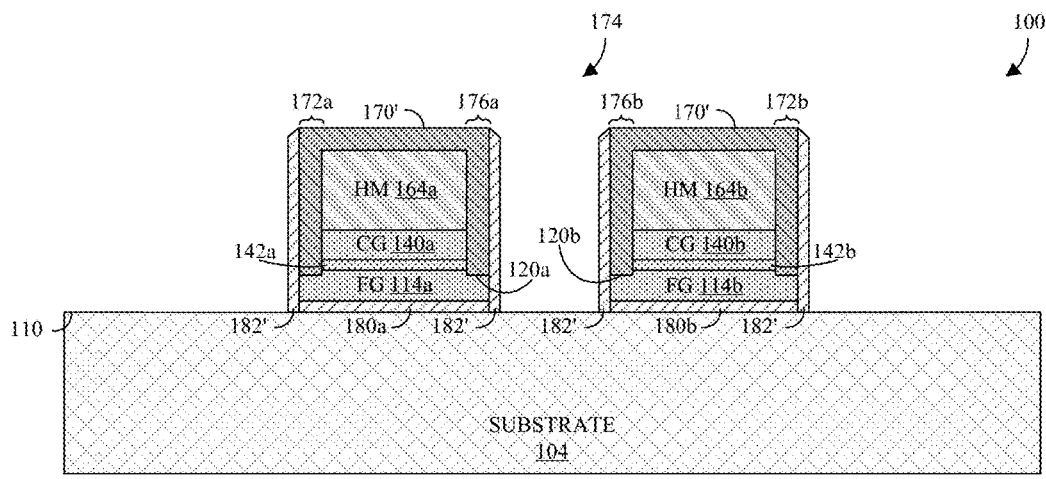
Figure 5I:
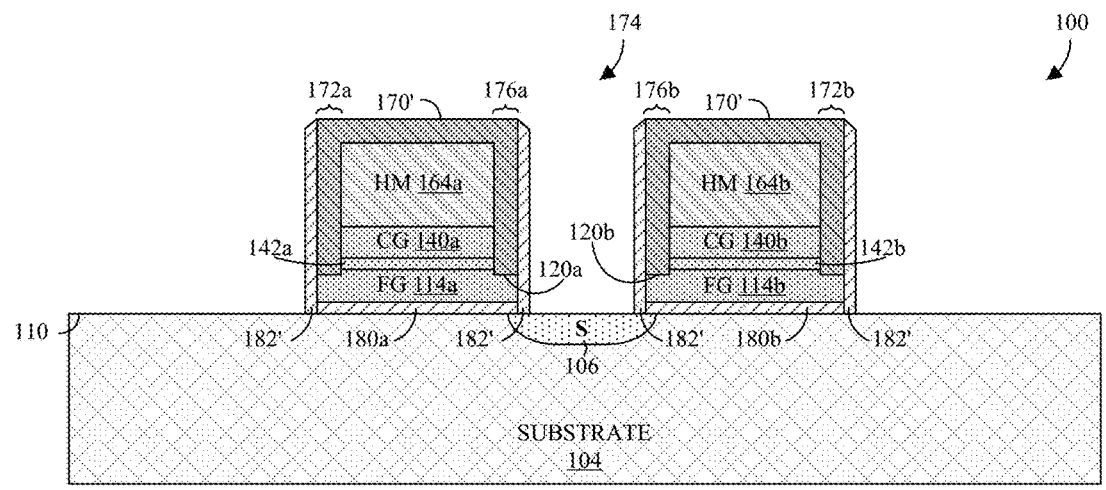
Figure 5J:
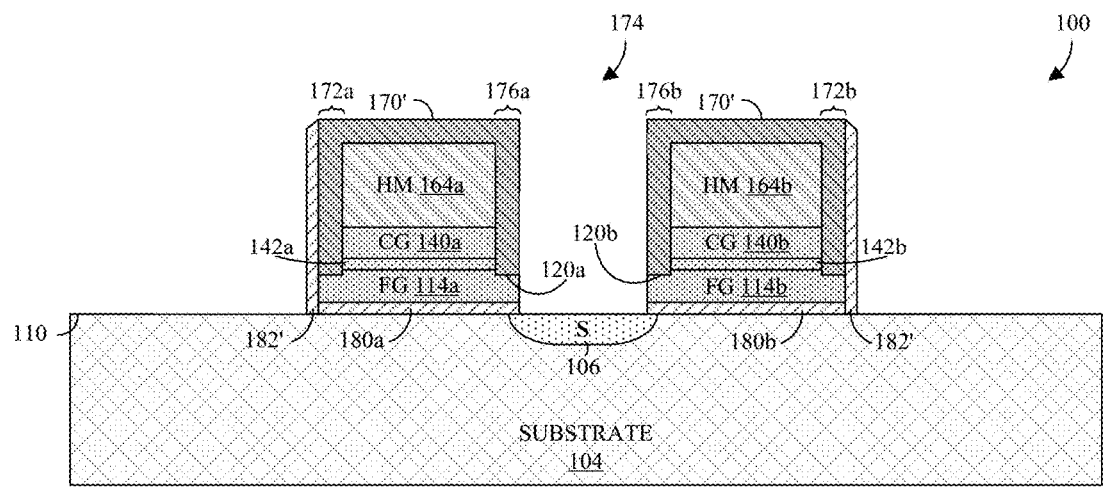
Figure 5K:
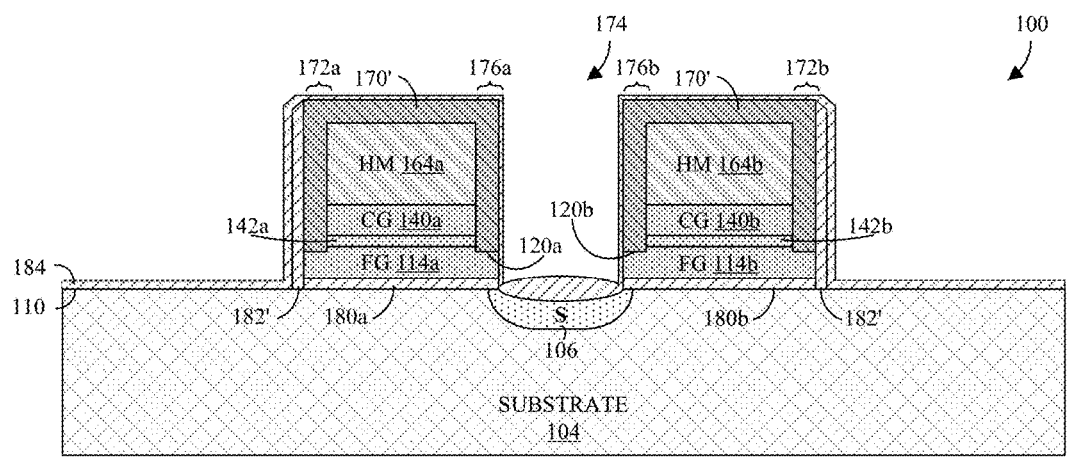
Figure 5L:
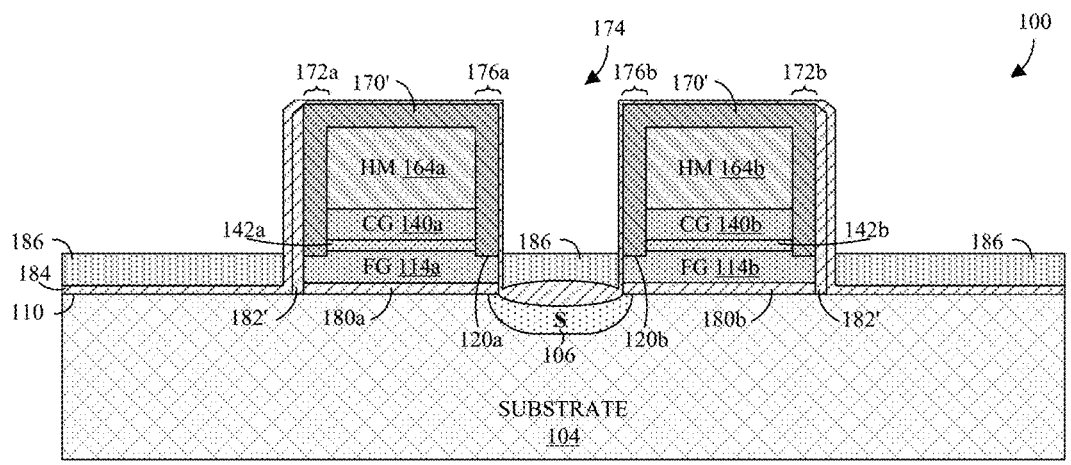
Figure 5M:
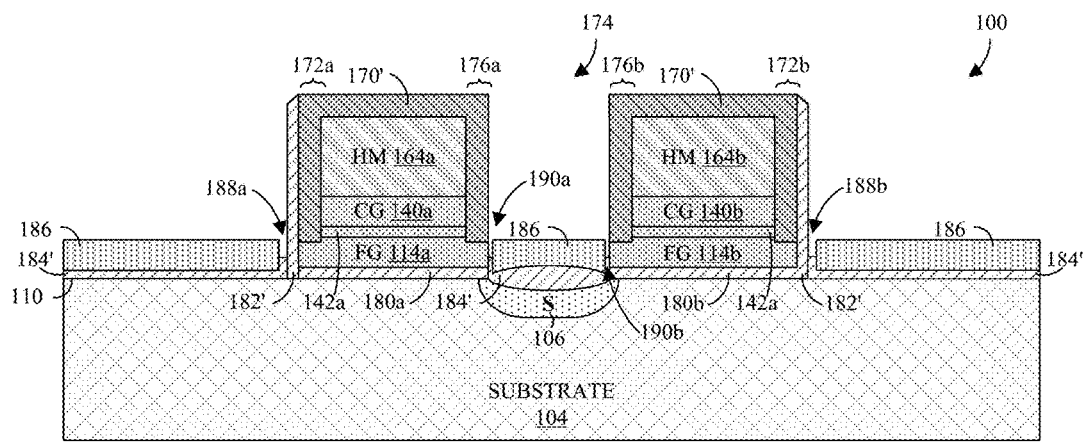
Figure 5N:
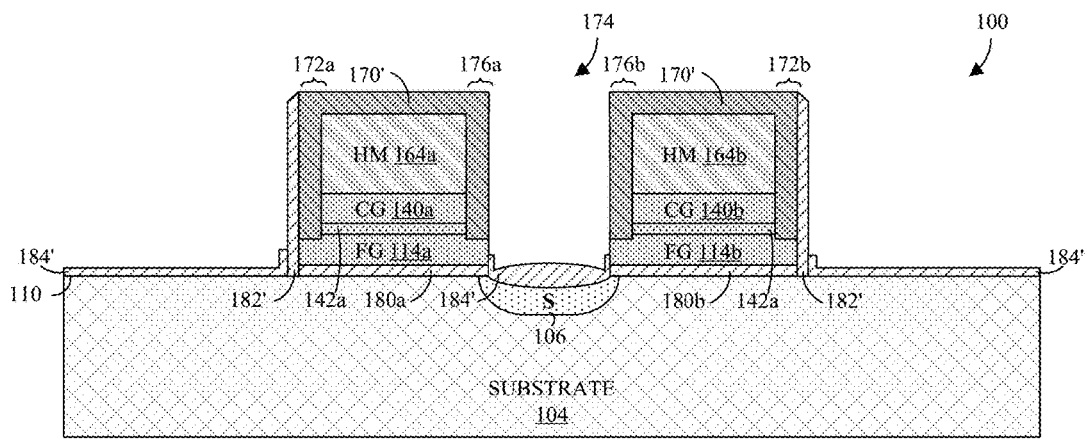
Figure 5O:
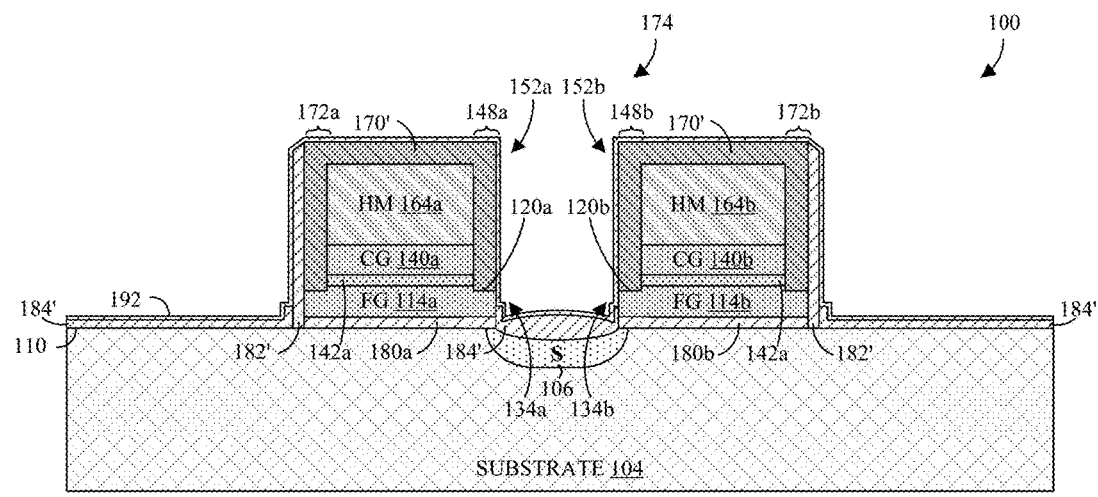
Figure 5P:
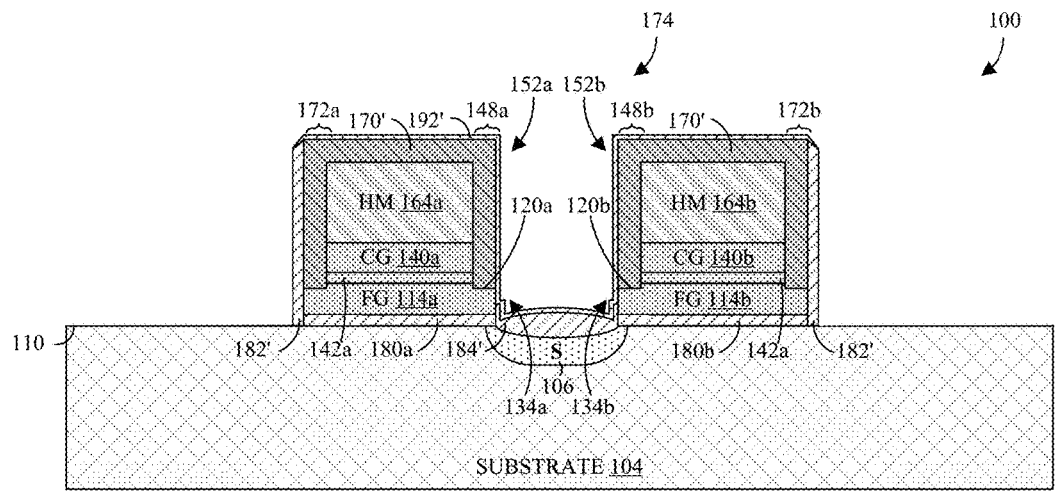
Figure 5Q:
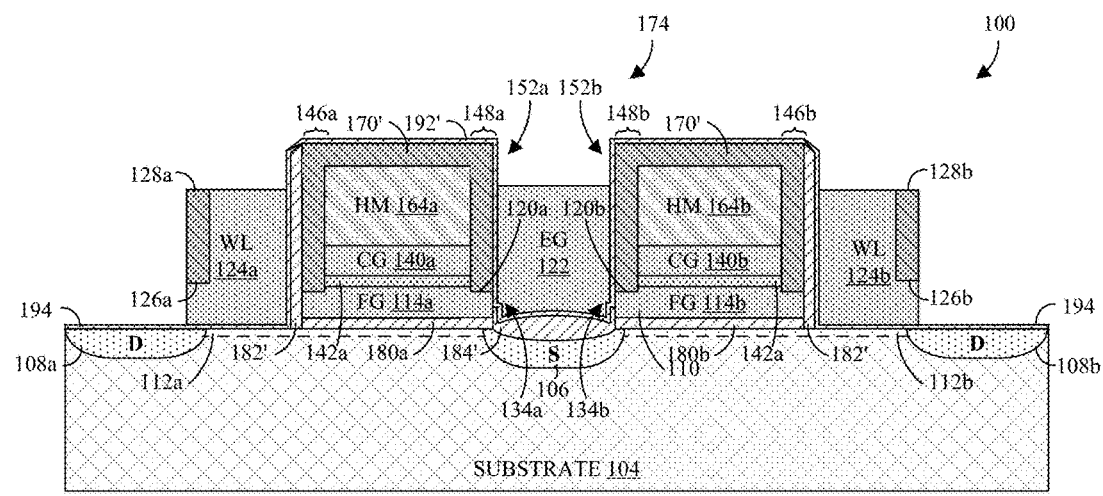

With reference to FIGS. 5A-Q, some embodiments of cross-sectional views of a semiconductor structure 100 at various stages of manufacture are provided to illustrate the method 300. Although FIGS. 5A-Q are described in relation to the method 300, it will be appreciated that the structures disclosed in FIGS. 5A-Q are not limited to the method 300, but instead may stand alone as structures independent of the method 300. Similarly, although the method 300 is described in relation to FIGS. 5A-Q, it will be appreciated that the method 300 is not limited to the structures disclosed in FIGS. 5A-Q, but instead may stand alone independent of the structures disclosed in FIGS. 5A-Q.

FIG. 5A illustrates a cross-sectional view of some embodiments corresponding to Action 302. As shown by FIG. 5A, a semiconductor substrate 104 is received. The semiconductor substrate 104 is typically planar with a uniform thickness. Further, the semiconductor substrate 104 is n- or p-type, and can, for example, be a handle wafer, such as a Si wafer or a silicon-on-insulator (SOI) substrate. If present, an SOI substrate is often made up of an active layer of high quality silicon in which the memory cells 102a, 102b are formed. In such instances, the memory cells 102a, 102b are arranged over a buried layer (BOX) of electrically insulating silicon dioxide, which is arranged over a bulk silicon support substrate.

FIG. 5B illustrates a cross-sectional view of some embodiments corresponding to Action 304. As shown by FIG. 5B, a first dielectric layer 154, a first conductive layer 156, a second dielectric layer 158, a second conductive layer 160, and a hard mask layer 162 are stacked or formed in that order on a surface 110 of the semiconductor substrate 104. The layers 154, 156, 158, 160, 162 are typically deposited with a uniform thickness. Examples of the layers 154, 156, 158, 160, 162 include silicon dioxide, polysilicon, an ONO dielectric, polysilicon, and a nitride-oxide-nitride (NON) dielectric, respectively.

FIG. 5C illustrates a cross-sectional view of some embodiments corresponding to Action 306. As shown by FIG. 5C, a first etch is performed through the hard mask, second conductive, and second dielectric layers 158, 160, 162 and partially into the first conductive layer 156 to form a pair of spaced control gates 140a, 140b. In some instances, this etching is performed using a photoresist mask. For example, a layer of photoresist can be deposited on the hard mask layer 162, typically with a uniform thickness. The photoresist layer is then patterned to create a mask masking control gate regions of the layers 154, 156, 158, 160, 162. With the mask generated, the semiconductor structure 100 is etched down to the first conductive layer 156 and the mask is removed.

The formed control gates 140a, 140b are sandwiched between an inter-gate dielectric region 142a, 142b and a hard mask 164a, 164b, and rest atop the remaining first conductive layer 156'. The inter-gate dielectric region 142a, 142b electrically isolates the remaining first conductive layer 156' from the control gates 140a, 140b, while the hard mask 164 masks the control gates 140a, 140b during manufacture. The remaining first conductive layer 156' includes a base region 166 of uniform thickness and an elevated region 168a, 168b atop the base region 166 for each control gate 140a, 140b of the semiconductor structure 100. The elevated region 168 for a control gate 140a, 140b supports the control gate 140a, 140b and/or otherwise acts as a pedestal for the control gate 140a, 140b.

FIG. 5D illustrates a cross-sectional view of some embodiments corresponding to Action 308. As shown in FIG. 5D, a third dielectric layer 170 is conformally formed over sidewalls of the control gates 140a, 140b and the inter-gate dielectric regions 142a, 142b, over the hard masks 164, and over the remaining first conductive layer 156'. Typically, the third dielectric layer 170 is an ONO dielectric, but other types of dielectrics can be used in place of the ONO dielectric.

FIG. 5E illustrates a cross-sectional view of some embodiments corresponding to Action 310. As shown in FIG. 5E, a second etch is performed through the third dielectric layer 170 to remove portions of the third dielectric layer 170 that line or are otherwise formed on a surface of the remaining first conductive layer 156'. In some embodiments, the second etch further removes portions of the third dielectric layer 170 lining a top surface of the hard masks 164. The second etch can be performed by removing the approximate thickness of the third dielectric layer 170 anisotropically in the vertical direction. Alternatively, the second etch can be performed according to a mask that masks the third dielectric layer 170 so that only those portions of the third dielectric layer 170 lining a surface of the remaining first conductive layer 156' are exposed. Upon completion of the second etch, the remaining third dielectric layer 170' forms peripheral spacers 172a, 172b lining sidewalls of the control gates 140a, 140b and arranged outside a central region 174 between the control gates 140a, 140b. Further, the remaining third dielectric layer 170' forms central spacers 176a, 176b lining sidewalls of the control gates 140a, 140b and arranged in the central region 174.

FIG. 5F illustrates a cross-sectional view of some embodiments corresponding to Action 312. As shown in FIG. 5F, a third etch is performed through the remaining first conductive layer 156' and the first dielectric layer 154 to remove peripheral portions 178a, 178b of the remaining first conductive layer 156' and the first dielectric layer 154. The peripheral portions 178 includes those portions outside the central region 174 that do not abut sidewalls of the control gates 140a, 140b (i.e., at the periphery of the control gates 140a, 140b). Upon completion of the third etch, a pair of floating gates 114a, 114b resting atop gate dielectrics 180a, 180b remain.

FIG. 5G illustrates a cross-sectional view of some embodiments corresponding to Action 314. As shown in FIG. 5G, a fourth dielectric layer 182 is conformably formed over the semiconductor substrate 104, the peripheral and central spacers 172, 176, the top surface of the hard masks 164, and exposed sidewalls of the floating gates 114a, 114b. Typically, the fourth dielectric layer 182 is a silicon oxide dielectric, but other types of dielectrics can be used in place of the silicon oxide dielectric. Further, the formation is typically performed by a high temperature oxide (HTO) deposition.

FIG. 5H illustrates a cross-sectional view of some embodiments corresponding to Action 316. As shown in FIG. 5H, a fourth etch is performed through the fourth dielectric layer 182 to remove portions of the fourth dielectric layer 182 that cover, line or are otherwise formed on the surface 110 of the semiconductor substrate 100. In some embodiments, the fourth etch further removes portions of the fourth dielectric layer 182 lining a top surface of the hard masks 164.

FIG. 5I illustrates a cross-sectional view of some embodiments corresponding to Action 318. As shown in FIG. 5I, a shared source/drain region 106 is embedded within the surface 110 of the semiconductor substrate 104. In some embodiments, the embedding is performed by masking peripheral regions of the semiconductor structure 100 (i.e., those regions outside the central region 174) with a photoresist. Thereafter, ions (e.g., n+ ions) are implanted into the semiconductor substrate 104 to form the shared source/drain region 106 with a predefined thickness, such as 20 A. With the shared source/drain region 106 embedded, the photoresist is removed. The shared source/drain region 106 is of an opposite type as the semiconductor substrate 104 or of an opposite type as a well region or active region in which the split gate flash memory cells 102a, 102b are formed.

FIG. 5J illustrates a cross-sectional view of some embodiments corresponding to Action 320. As shown in FIG. 5J, a fifth etch is performed through the remaining fourth dielectric layer 182' to remove portions of the remaining fourth dielectric layer 182' within the central region 174 between the control gates 140a, 140b. Typically, the fifth etch is performed using a wet etch.

FIG. 5K illustrates a cross-sectional view of some embodiments corresponding to Action 322. As shown in FIG. 5K, a fifth dielectric layer 184 is conformably formed over the semiconductor substrate 104, the remaining third and fourth dielectric layers 170', 182', and the exposed sidewalls of the floating gates 114a, 114b in the central region 174. Typically, the fifth dielectric layer 184 is a silicon oxide dielectric, but other types of dielectrics can be used in place of the silicon oxide dielectric. Further, the formation is typically performed by depositing 50 A of oxide by in-situ steam generation, 60 A by HTO deposition, and 50 A by wet oxide deposition.

FIG. 5L illustrates a cross-sectional view of some embodiments corresponding to Action 324. As shown in FIG. 5L, a mask 186 is formed over the fifth dielectric layer 184 that includes a top surface approximately coplanar with top surfaces of the floating gates 114a, 114b and that includes a thickness approximately equal to a thickness of the floating gates 114a, 114b. In some embodiments, the top surface of the mask 186 is coplanar with central floating gate ledges 120a, 120b of the floating gates 114a, 114b. The mask 186 is typically formed of a bottom anti-reflective coating (BARC). Further, in some embodiments, the formation includes depositing BARC to coat the semiconductor structure 100 and subsequently etching back the deposition to approximately the top surfaces of the floating gates 114a, 114b.

FIG. 5M illustrates a cross-sectional view of some embodiments corresponding to Action 302. As shown in FIG. 5M, a sixth etch is performed through the fifth dielectric layer 184 according to the mask 186 to etch back portions of the fifth dielectric layer 184 between the floating gates 114a, 114b and the mask 186. The sixth etch typically removes those portions of the fifth dielectric layer 184 not masked by the mask 186 or otherwise abutting the mask 186. Further, the sixth etch typically creates peripheral trenches 188a, 188b between the mask 186 and the remaining portions of the fourth dielectric layer 182', as well as central trenches 190a, 190b between the mask 186 and the floating gates 114a, 114b. The depth of the trenches is typically between a ⅓ and ⅔ of the thickness of the mask 186. The sixth etch can be performed by, for example, a wet dip approach.

FIG. 5N illustrates a cross-sectional view of some embodiments corresponding to Action 328. As shown in FIG. 5N, the mask 186 is removed to expose the remaining fifth dielectric layer 184', which partially lines sidewalls of the floating gates 114a, 114b in the central region 174.

FIG. 5O illustrates a cross-sectional view of some embodiments corresponding to Action 330. As shown in FIG. 5O, a sixth dielectric layer 192 is conformably formed over the remaining third, fourth, and fifth dielectric layers 170', 182', 184'. The sixth dielectric layer 192 is typically about 40-60 A. Further, the sixth dielectric layer 192 is typically a silicon oxide dielectric, but other types of dielectrics can be used in place of the silicon oxide dielectric. For each control gate 140a, 140b, the formation yields a first central dielectric extension 134a, 134b extending up to the central floating gate ledge 120a, 120b. Further, for each control gate 140a, 140b, the formation yields a central dielectric sidewall region 148a, 148b including the first central dielectric extension 134a, 134b, as well as a second dielectric extension 152a, 152b extending up from the central floating gate ledge 120a, 120b.

FIG. 5P illustrates a cross-sectional view of some embodiments corresponding to Action 332. As shown in FIG. 5P, a seventh etch is performed through the remaining fifth dielectric layer 184' and the sixth dielectric layer 192 to remove portions outside the central region 174. The seventh etch can completely or partially remove the remaining fifth dielectric layer 184' and the sixth dielectric layer 192. However, the seventh etch typically removes the sixth dielectric layer 192 and the remaining fifth dielectric layer 184' outside the central region 174.

FIG. 5Q illustrates a cross-sectional view of some embodiments corresponding to Actions 334 and 336. As shown in FIG. 5Q, an erase gate 122 is formed in the central region 174 over the shared source/drain region 106, and word lines 124a, 124b are formed at the periphery of the semiconductor structure 100 adjacent to the floating gates 114a, 114b. In some embodiments, the erase gate 122 and the word lines 124a, 124b are formed by forming a dielectric layer, etching the dielectric layer to remove portions in the central region 174, depositing a conductive material, such as polysilicon or metal, on the remaining dielectric layer 194, etching the conductive material to carve out word line ledges 126a, 126b for each world line 124a, 124b, depositing a dielectric material, such as silicon nitride, and etching the dielectric material to rest upon the word line ledges 126a, 126b.

Also shown in FIG. 5Q, a pair of individual source/drain regions 108a, 108b (one for each split gate flash memory cell 102a, 102b) are formed at the periphery of the semiconductor structure 100 adjacent to the word lines 124a, 124b. Typically, the individual source/drain regions 108a, 108b are formed after the word lines 124a, 124b are formed. In some embodiments, the individual source/drain regions 108a, 108b are formed by masking the central region 174 with a photoresist. Thereafter, ions (e.g., n+ ions) of the same type as the shared source/drain region 106 are implanted into the semiconductor substrate 104 to form the two individual source/drain regions 108a, 108b with a predefined thickness, such as 20 A. The individual source/drain regions 106, 108a, 108b are spaced apart with the shared source/drain region 106 in the middle of the two individual source/drain regions 108a, 108b. Further, each individual source/drain region 108a, 108b and the shared source/drain region 106 define a channel region 112a, 112b therebetween.

FIG. 1 illustrates a cross-sectional view of some embodiments corresponding to Action 338. As shown in FIG. 1, the semiconductor structure 100 is planarized down to the control gates 140a, 140b. Of note, FIG. 1 does not discriminate between adjoining layers of the same material type (e.g., oxide). The planarization removes the hard mask 164, as well as portions of the peripheral and central sidewall dielectric regions 146a, 146b, 148a, 148b, the word lines 124a, 124b, and dielectrics 128a, 128b resting upon the word line ledges 126a, 126b. Further, the planarization can be performed by, for example, chemical mechanical polishing (CMP).

Thus, as can be appreciated from above, the present disclosure provides a semiconductor structure of a split gate flash memory cell that utilizes a variable thickness dielectric between erase and floating gates. In some embodiments, the semiconductor structure includes a semiconductor substrate including a source region and a drain region. Further, the semiconductor structure includes a floating gate, a word line, and an erase gate located over the semiconductor substrate between the source and drain regions. The floating gate is arranged between the word line and the erase gate. Even more, the semiconductor structure includes a dielectric disposed between the erase and floating gates. A thickness of the dielectric between the erase and floating gates is variable and increases towards the semiconductor substrate.

In other embodiments, the present disclosure provides a method of manufacturing a semiconductor structure of a split gate flash memory cell. A semiconductor structure is received that includes a pair of floating gates spaced atop a semiconductor substrate to define a central region therebetween. Dielectric material is formed having a variable thickness along sidewalls of the floating gates in the central region. The dielectric material increases in thickness towards the semiconductor substrate between top and bottom surfaces of the floating gates. An erase gate is formed in the central region at a position separated from the pair of floating gates by the dielectric material.

In yet other embodiments, the present disclosure provides a semiconductor structure of a split gate flash memory cell. The semiconductor structure includes a semiconductor substrate that has a shared source/drain region and two individual source/drain regions. The shared and individual source/drain regions are spaced along a surface of the semiconductor substrate with the shared source/drain region between the two individual source/drain regions. The semiconductor structure further includes two split gate memory cells disposed between the shared source/drain region and correspondingly the two individual source/drain regions. One of the split gate memory cells includes a floating gate, a word line, and an erase gate spaced over the surface between the shared source/drain region and a corresponding individual source/drain region. The floating gate is arranged between the word line and the erase gate. Further, the split gate memory cell includes a dielectric disposed between the erase and floating gates. A thickness of the dielectric between the erase and floating gates is variable and increases towards the semiconductor substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure of a split gate flash memory cell, said semiconductor structure comprising:
   a semiconductor substrate including a source region and a drain region;
   a floating gate, a word line, and an erase gate located over the semiconductor substrate, wherein the floating gate and the word line are located between the source and drain regions, wherein the floating gate is arranged between the word line and the erase gate and includes a ledge recessed below a top surface of the floating gate by a first vertical distance, and wherein a bottom surface of the floating gate is closer to the semiconductor substrate than the top surface of the floating gate; and
   a dielectric structure made up of an upper portion and a lower portion which are disposed between the erase gate and the floating gate, wherein a sidewall of the upper portion and a sidewall of the lower portion contact a second ledge, which is recessed below the top surface of the floating gate by a second vertical distance that is greater than the first vertical distance, and wherein an edge portion of the erase gate overhangs and contacts the second ledge.

2. The semiconductor structure according to claim 1, further including:
   a control gate disposed above the floating gate; and
   a second dielectric structure disposed between the control gate and the floating gate.

3. The semiconductor structure according to claim 1, wherein a bottom surface of the word line is spaced below the bottom surface of the floating gate, and wherein a bottom surface of the erase gate is spaced above the bottom surface of the floating gate.

4. The semiconductor structure according to claim 1, wherein the sidewall of the upper portion and the sidewall of the lower portion contact the second ledge respectively at opposite sides of the second ledge, wherein the second ledge is planar, and wherein the sidewalls respectively of the lower portion and the upper portion are planar and contact the erase gate.

5. A semiconductor structure of a split gate flash memory cell, said semiconductor structure comprising:
   a semiconductor substrate including a shared source/drain region and two individual source/drain regions, the shared and individual source/drain regions spaced along a surface of the semiconductor substrate with the shared source/drain region between the two individual source/drain regions; and
   two split gate memory cells disposed between the two individual source/drain regions, wherein one of the split gate memory cells includes:
     a floating gate, a word line, and an erase gate spaced over the surface, wherein the floating gate and the word line are arranged between the shared source/drain region and a corresponding individual source/drain region, and wherein the floating gate is arranged between the word line and the erase gate; and a dielectric structure disposed between the erase gate and the floating gate, wherein a thickness of the dielectric structure between the erase gate and the floating gate is variable and increases towards the semiconductor substrate, wherein the dielectric structure has a stepped profile vertically between a top surface of the floating gate and a bottom surface of the floating gate, wherein the stepped profile is thicker at a bottom of the floating gate and comprises a ledge vertically spaced between the top surface of the floating gate and the bottom surface of the floating gate, wherein the ledge of the stepped profile extends laterally from a first sidewall of the dielectric structure to a second sidewall of the dielectric structure, wherein the first and second sidewalls of the dielectric structure contact the erase gate, and wherein a thickness of the dielectric structure is substantially uniform from the top surface of the floating gate to a top surface of the dielectric structure.

6. The semiconductor structure according to claim 5, wherein the dielectric structure includes a bottom region and a top region located atop the bottom region, the bottom region including a bottom surface approximately coplanar with the bottom surface of the floating gate and a first thickness greater than a second thickness of the top region, and the top region including a top surface approximately coplanar with the top surface of the floating gate.

7. The semiconductor structure according to claim 6, wherein the second thickness of the top region is uniform and the first thickness of the bottom region is uniform.

8. The semiconductor structure according to claim 6, wherein the floating gate comprises a planar sidewall abutting the top and bottom regions, and wherein the erase gate comprises a non-planar sidewall abutting the top and bottom regions.

9. The semiconductor structure according to claim 5, further comprising:
   a control gate disposed above the floating gate; and
   a second dielectric structure disposed between the control gate and the floating gate.

10. The semiconductor structure according to claim 5, wherein the floating gate comprises a ledge recessed below the top surface of the floating gate, and wherein the stepped profile is arranged between the ledge of the floating gate and the bottom surface of the floating gate.

11. The semiconductor structure according to claim 5, wherein the top surface of the dielectric structure is coplanar with a top surface of the erase gate.

12. The semiconductor structure according to claim 5, wherein the first sidewall of the dielectric structure extends continuously to a top surface of the erase gate, wherein the second sidewall of the dielectric structure extends continuously to a bottom surface of the erase gate, and wherein the bottom surface of the erase gate is concave and arcs between opposite sides of the erase gate.

13. The semiconductor structure according to claim 12, wherein the ledge of the stepped profile contacts a lower surface of the erase gate that overhangs the ledge of the stepped profile, and wherein the ledge of the stepped profile and the lower surface of the erase gate are planar.

14. The semiconductor structure according to claim 12, further comprising:
   a second dielectric structure arranged between the word line and the floating gate, wherein the second dielectric structure has a first lateral thickness between the ledge of the floating gate and the bottom surface of the floating gate, and wherein the first lateral thickness of the second dielectric structure is greater than a first maximum lateral thickness of the dielectric structure between the ledge of the floating gate and the bottom surface of the floating gate.

15. The semiconductor structure according to claim 14, wherein the second dielectric structure has a second lateral thickness between the ledge of the floating gate and a top surface of the erase gate, wherein the second lateral thickness of the second dielectric structure is greater than the first lateral thickness of the second dielectric structure, wherein the dielectric structure has a second maximum lateral thickness between the ledge of the floating gate and the top surface of the erase gate, and wherein the second maximum lateral thickness of the dielectric structure is greater than the first maximum lateral thickness of the dielectric structure.

* * * * *